(12) United States Patent
Barclay et al.

(10) Patent No.: US 7,105,266 B2
(45) Date of Patent: Sep. 12, 2006

(54) POLYMERS CONTAINING OXYGEN AND SULFUR ALICYCLIC UNITS AND PHOTORESIST COMPOSITIONS COMPRISING SAME

(75) Inventors: George G. Barclay, Jefferson, MA (US); Wang Yueh, Portland, OR (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/039,340

(22) Filed: Dec. 31, 2001

(65) Prior Publication Data

US 2003/0073030 A1 Apr. 17, 2003

Related U.S. Application Data

(63) Continuation of application No. PCT/US01/14914, filed on May 8, 2001, which is a continuation-in-part of application No. 09/567,634, filed on May 9, 2000, now Pat. No. 6,306,554.

(51) Int. Cl.
*G03F 7/039* (2006.01)
*G03F 7/30* (2006.01)

(52) U.S. Cl. .............................. 430/270.1; 430/272.1; 430/326; 430/311

(58) Field of Classification Search .............. 430/270.1, 430/326
See application file for complete search history.

(56) References Cited

U.S. PATENT DOCUMENTS

| | | | | |
|---|---|---|---|---|
| 5,130,392 A | * | 7/1992 | Schwalm et al. | 526/288 |
| 5,453,341 A | * | 9/1995 | Schwalm | 430/18 |
| 5,759,750 A | * | 6/1998 | Binder et al. | 430/326 |
| 5,843,624 A | | 12/1998 | Houlihan et al. | 430/270.1 |
| 6,103,445 A | * | 8/2000 | Willson et al. | 430/270.1 |
| 6,143,472 A | | 11/2000 | Sumino et al. | 430/270.1 |
| 6,146,810 A | | 11/2000 | Seo et al. | 430/270.1 |
| 6,150,069 A | | 11/2000 | Jung et al. | 430/270.1 |
| 6,197,476 B1 | * | 3/2001 | Chang et al. | 430/270.1 |
| 6,280,898 B1 | * | 8/2001 | Hasegawa et al. | 430/270.1 |
| 6,517,990 B1 | * | 2/2003 | Choi et al. | 430/270.1 |
| 6,566,038 B1 | * | 5/2003 | Nishi et al. | 430/270.1 |

FOREIGN PATENT DOCUMENTS

| | | | |
|---|---|---|---|
| EP | 0 836 119 A1 | | 4/1998 |
| EP | 0915382 A2 | * | 5/1999 |
| EP | 0 989462 A1 | * | 3/2000 |
| GB | 2 320 718 A | | 7/1998 |
| WO | WO 01/86353 A1 | * | 11/2001 |

OTHER PUBLICATIONS

U.S. Appl. No. 60/198,761, filed Apr. 21, 2000.*
IUPAC, International Union of Pure and Applied Chemistry, from web version of IUPAC Recommendations 1994, "Glossary of Class Names of Organic Compounds and Reactive Intermediates Based on Structure", entery for "oxo compounds" 9 pages, year 1994.*
IUPAC, Extention and Revision of the von Baeyer System for Naming Polycyclic Compounds (including Bicyclic Compounds, IUPAC recommendations 1999, Synopsis, Preamble, VB-1 to VB-5, 4 pages.*

* cited by examiner

*Primary Examiner*—Cynthia Hamilton
(74) *Attorney, Agent, or Firm*—Peter F. Corless; Darryl P. Frickey; Edwards Angell Palmer & Dodge, LLP

(57) ABSTRACT

The invention includes polymers that contain a heterocyclic ring, preferably an oxygen- or sulfur-containing ring. The heterocyclic ring is preferably fused to the polymer backbone. The invention also provides photoresists that contain such polymers, particularly for imaging at short wavelengths such as sub-200 nm.

20 Claims, No Drawings

POLYMERS CONTAINING OXYGEN AND SULFUR ALICYCLIC UNITS AND PHOTORESIST COMPOSITIONS COMPRISING SAME

The present application is a continuation of International Application No. PCT/US01/14914 filed May 8, 2001, which is a continuation-in-part of U.S. application Ser. No. 09/567,634, filed May 9, 2000, now issued as U.S. Pat. No. 6,306,554.

BACKGROUND OF THE INVENTION

1. Field of the Invention

The present invention relates to new polymers that contain oxygen and/or sulfur alicyclic (heteroalicyclic) units and use of such polymers as a resin binder component for photoresist compositions, particularly chemically-amplified positive-acting resists that an be effectively imaged at short wavelengths such as sub-200 nm, particularly 193 nm.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer. See also R. D. Allen et al., Proceedings of SPIE, 2724:334–343 (1996); and P. Trefonas et al. Proceedings of the 11th International Conference on Photopolymers (Soc. Of Plastics Engineers), pp 44–58 (Oct. 6, 1997).

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 248 nm (provided by KrF laser) or 193 nm (provided by an ArF exposure tool). See European Published Application EP915382A2. Use of such short exposure wavelengths can enable formation of smaller features. Accordingly, a photoresist that yields well-resolved images upon 248 nm or 193 nm exposure could enable formation of extremely small (e.g. sub-0.25 μm) features that respond to constant industry demands for smaller dimension circuit patterns, e.g. to provide greater circuit density and enhanced device performance.

However, many current photoresists are generally designed for imaging at relatively higher wavelengths, such as G-line (436 nm) and I-line (365 nm) are generally unsuitable for imaging at short wavelengths such as sub-200 nm. Even shorter wavelength resists, such as those effective at 248 nm exposures, also are generally unsuitable for sub-200 nm exposures, such as 193 nm imaging.

More specifically, current photoresists can be highly opaque to extremely short exposure wavelengths such as 193 nm, thereby resulting in poorly resolved images.

It thus would be desirable to have new photoresist compositions, particularly resist compositions that can be imaged at short wavelengths such as sub-200 nm exposure wavelengths, particularly 193 nm.

SUMMARY OF THE INVENTION

We have now found novel polymers and photoresist compositions that comprise the polymers as a resin binder component. The photoresist compositions of the invention can provide highly resolved relief images upon exposure to extremely short wavelengths, particularly sub-200 nm wavelengths such as 193 nm.

Polymers of the invention contain a oxygen- and/or sulfur-containing heteroalicyclic ring that is preferably fused to the polymer backbone (i.e. at least two heteroalicyclic ring atoms as part of the polymer backbone). The heteroalicyclic ring has one or more oxygen and/or sulfur atoms as ring members.

Preferred polymers of the invention also contain a carbon alicyclic group (i.e. the group has all carbon ring members) that is fused to the polymer backbone, i.e. the carbon alicyclic ring has at least two carbon ring members that comprise the polymer backbone. Preferred fused carbon alicyclic groups are provided by polymerization of cyclic olefin (endocyclic double bond) compounds such as optionally substituted norbornene groups. We have found that incorporation of such carbon alicyclic groups into a polymer can significantly increase plasma etch resistance of a photoresist containing the polymer.

Preferred heteroalicyclic polymer units may be substituted, e.g. by heteroalkyl groups such as ethers (alkoxy) preferably having 1 to about 10 carbon atoms, alkylthio preferably having 1 to about 10 carbon atoms, alkylsulfinyl preferably 1 to about 10 carbon atoms, alkylsulfonyl preferably having 1 to about 10 carbon atoms, and the like. It has been surprising found that such substituents can provide enhanced lithographic results, particularly enhanced substrate adhesion.

For use in photoresist compositions, polymers of the invention also will contain one or more units that comprise photoacid-labile moieties. The photoacid-labile group may be a substituent of one or more of the above-mentioned units, such as a substituent of a polymerized vinyl alicyclic ether, vinyl alicyclic thioether or carbon alicyclic group. The photoacid labile moiety also may be present as an additional polymer unit, e.g. as a polymerized alkyl acrylate or alkylmethacrylate, particularly an acrylate having an alicyclic moiety such as methyladamantyl acrylate or methyladamantyl methacrylate. Preferred alicyclic photoacid-labile moieties are tertiary ester alicyclic hydrocarbon groups that have two or more fused or bridged rings. Preferred tertiary ester groups include optionally substituted adamantyl, particularly methyl adamantyl as mentioned above; optionally substituted fencyl groups, particularly ethyl fencyl; optionally substituted pinanyl; and optionally substituted tricyclo decanyl, particularly an alkyl-substituted tricyclo decanyl such as 8-ethyl-8-tricyclodecanyl e.g. as provided by polymerization of 8-ethyl-8-tricyclodecanyl acrylate and 8-ethyl-8-tricyclodecanyl methacrylate. Additional alicyclic ester groups also will be suitable, including additional bicyclic, tricyclic and other polycyclic moieties.

Polymers of the invention also may contain units in addition to the above groups. For example, polymers of the invention also may contain nitrile units such as provided by polymerization of methacrylonitrile and acrylonitrile. Additional contrast enhancing groups also may be present in polymers of the invention, such as groups provided by polymermization of methacrylic acid, acrylic acid, and such acids protected as photoacid labile esters, e.g. as provided by reaction of ethoxyethyl methacrylate, t-butoxy methacrylate, t-butylmethacrylate and the like.

Generally preferred polymers of the invention contain 3, 4 or 5 distinct repeat units, i.e. preferred are terpolymers, tetrapolymers and pentapolymers that contain one or more heteroalicyclic groups as disclosed herein.

Polymers of the invention are preferably employed in photoresists imaged at 193 nm, and thus preferably will be substantially free of any phenyl or other aromatic groups. For example, preferred polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

The invention also provides methods for forming relief images, including methods for forming a highly resolved relief image such as a pattern of lines where each line has essentially vertical sidewalls and a line width of about 0.40 microns or less, and even a width of about 0.25, 0.20 or 0.16 microns or less. The invention further provides articles of manufacture comprising substrates such as a microelectronic wafer substrate or liquid crystal display or other flat panel display substrate having coated thereon a polymer, photoresist or resist relief image of the invention. Other aspects of the invention are disclosed infra.

DETAILED DESCRIPTION OF THE INVENTION

As discussed above, polymers of the invention contain a heteroalicyclic ring that is preferably fused to a polymer backbone. The fused heterocyclic ring units contain one or more oxygen and/or sulfur atoms. By stating herein that a cyclic group is fused to a polymer backbone, it is meant that two ring members of the cyclic group, typically two adjacent carbon atoms of the cyclic group, are also part of the polymer backbone. Such a fused ring can be provided by polymerizing a cyclic monomer that has an endocyclic double bond.

The oxygen and/or sulfur atoms of the heteroalicyclic ring are preferably direct ring members (bi-radical linkages), rather than e.g. a multiple bond group such as a keto or thioketo ring member. Also, less preferred are groups that contain any such saturated groups such as a ketone or other carbonyl including ester, lactone, anhydride, etc.

Preferred oxygen ring polymer units will be free of other hetero atoms such as sulfur (i.e. only oxygen and carbon ring members). Typically, the oxygen ring unit will contain a single oxygen ring atom and may have one or more ring substituents. As discussed above, it has been found that such ring substituents can significantly enhance substrate adhesion.

Additionally, an oxygen heteroalicyclic group will be present in a polymer together with polymerized carbon alicyclic compounds such as optionally substituted norbornene. As referred to herein, the term "carbon alicyclic group" means each ring member of the non-aromatic group is carbon. The carbon alicyclic group can have one or more endocyclic carbon-carbon double bonds, provided the ring is not aromatic.

Preferred polymers of the invention that contain oxygen heteroalicyclic units comprise a structure of the following Formula I:

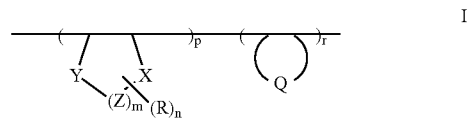

wherein X, Y, and each Z are each independently carbon or oxygen, with at least one of X, Y or Z being oxygen, and preferably no more than two of X, Y and Z being oxygen;

Q represents an optionally substituted carbon alicyclic ring fused to the polymer backbone (i.e. two Q ring members being adjacent carbons of the polymer backbone); the alicyclic ring suitably having from about 5 to about 18 carbon atoms and is suitably a single ring (e.g. cyclopentyl, cyclohexyl or cycloheptyl), or more preferably Q is polycyclic e.g. and contain 2, 3, 4 or more bridged, fused or otherwise linked rings, and preferred substituents of a substituted Q group include photoacid-labile moieties such as a photoacid-labile ester;

each R is the same or different non-hydrogen substituent such as cyano; optionally substituted alkyl preferably having 1 to about 10 carbon atoms; optionally substituted alkanoyl preferably having 1 to about 10 carbon atoms; optionally substituted alkoxy preferably having 1 to about 10 carbon atoms; optionally substituted alkylthio preferably having 1 to about 10 carbon atoms; optionally substituted alkylsulfinyl preferably 1 to about 10 carbon atoms; optionally substituted alkylsulfonyl preferably having 1 to about 10 carbon atoms; optionally substituted carboxy preferably have 1 to about 10 carbon atoms (which includes groups such as —COOR' where R' is H or $C_{1-8}$alkyl, including esters that are substantially non-reactive with photoacid); a photoacid-labile group such as a photoacid-labile ester e.g. a tert-butyl ester and the like; etc.

m is 1 (to provide a fused five-membered ring), 2 (to provide a fused six-membered ring), 3 (to provide a fused seven-membered ring), or 4 (to provide a fused eight-membered ring);

n is an integer of from 0 (i.e. no R ring substituents), I (i.e. a single R ring substituent) to the maximum possible value permitted by the valences of the ring members, and preferably n is 0, 1, 2, 3, 4 or 5, and more preferably n is 0, 1, 2 or 3;

p is the mole fraction of the fused oxygen ring units based on total units in the polymer, and r is the mole fraction of the fused carbon alicyclic ring units based on total units in the polymer, and p and r are each greater than zero.

As discussed above, preferred carbon alicyclic ring units are polymerized optionally substituted norbornene groups. Thus, preferred polymers that contain oxygen heteroalicyclic units comprise a structure of the following Formula IA:

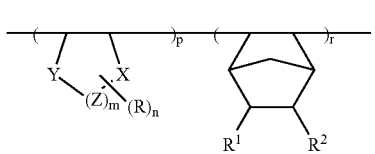

IA wherein X, Y, Z, R, m and n are the same specified for Formula I above;

$R^1$ and $R^2$ are each independently hydrogen or a non-hydrogen substituent such as halo (F, Cl, Br, I), nitro, cyano, optionally substituted alkyl (including cycloalkyl) preferably having from 1 to about 16 carbons; optionally substituted alkoxy preferably having from 1 to about 16 carbons; optionally substituted alkylthio preferably having from 1 to about 16 carbons; optionally substituted carboxy preferably have 1 to about 10 carbon atoms (which includes groups such as —COOR' where R' is H or $C_{1-8}$alkyl, including esters that are substantially non-reactive with photoacid); a lactone; an anhydride such as an itaconic anhydride group; a photoacid-labile group such as a photoacid-labile ester, particularly a photoacid-labile ester moiety with a tertiary alicyclic group or a non-cyclic group such as t-butyl; and the like, or $R^1$ and $R^2$ may be taken together to form one or more rings fused to the depicted norbornyl ring;

p is the mole fraction of the fused oxygen ring units based on total units in the polymer; and r is the mole fraction of the fused optionally substituted norbornene ring units based on total units in the polymer, and p and r are each greater than zero.

Particularly preferred oxygen ring polymer units include those that have five or six ring members and an oxygen ring member adjacent to the polymer backbone. Accordingly, preferred are polymers that comprise a structure of the following Formula IB:

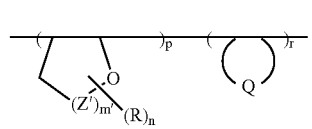

IB wherein each Z' is independently oxygen, sulfur or carbon, and preferably each Z' is carbon; m' is 1, 2, 3 or 4; and R and n are each the same as defined in Formula I above, and preferably n is 0, 1, 2, 3, 4 or 5, and more preferably n is 0, 1, 2 or 3;

Q is the same as defined in Formula I;

p is the mole fraction of the fused oxygen ring units based on total units in the polymer; and r is the mole fraction of the fused carbon alicyclic ring units based on total units in the polymer, and p and r are each greater than zero.

Preferred polymers of Formula IB contain polymerized norbornene units, e.g. polymers that comprise a structure of the following Formula IC:

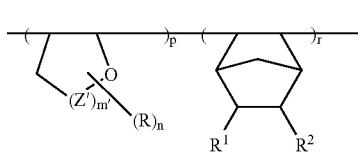

IC wherein Z', m', R, n, and p are the same as defined in Formula IB; and $R^1$, $R^2$ and r are the same as defined in Formula IA.

Preferred sulfur ring polymer units also will be free of other hetero atoms such as oxygen (i.e. only sulfur and carbon ring members), or will contain only one or two other hetero atoms such as oxygen, typically only one additional heteroatom such as oxygen.

Preferred sulfur ring polymer units include those of the following Formula II:

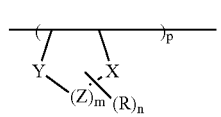

II wherein X, Y, and each Z are each independently carbon, oxygen or sulfur, with at least one of X, Y or Z being sulfur, and preferably no more than two of X, Y and Z being sulfur;

each R is the same or different non-hydrogen substituent such as cyano; optionally substituted alkyl preferably having 1 to about 10 carbon atoms; optionally substituted alkanoyl preferably having 1 to about 10 carbon atoms; optionally substituted alkoxy preferably having 1 to about 10 carbon atoms; optionally substituted alkylthio preferably having 1 to about 10 carbon atoms; optionally substituted alkylsulfinyl preferably 1 to about 10 carbon atoms; optionally substituted alkylsulfonyl preferably having 1 to about 10 carbon atoms; optionally substituted carboxy preferably have 1 to about 10 carbon atoms (which includes groups such as —COOR' where R' is H or $C_{1-8}$alkyl, including esters that are substantially non-reactive with photoacid); a photoacid-labile group such as a photoacid-labile ester e.g. a tert-butyl ester and the like; etc.

m is 1 (to provide a fused five-membered ring), 2 (to provide a fused six-membered ring), 3 (to provide a fused seven-membered ring) or 4 (to provide a fused eight-membered ring);

n is an integer of 0 (no R substituents present), 1 (i.e. a single R ring substituent) to the maximum possible substitution permitted by the valences of the ring members, and preferably n is 0, 1, 2, 3, 4 or 5, and more preferably n is 0, 1, 2 or 3; and p is greater than zero and is the mole fraction of the fused sulfur ring units based on total units in the polymer.

Particularly sulfur ring polymer units include those that have five, six or seven ring members and an sulfur ring member adjacent to the polymer backbone, such as units of the following Formula IIA:

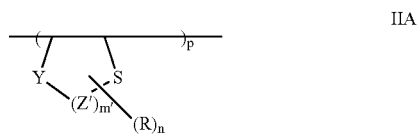

IIA wherein Y is the same as specified for Formula I above;

wherein each Z' is independently carbon; oxygen, or sulfur; and preferably is Z' is carbon; m' is 1, 2, 3 or 4; and R and n are each the same as defined in Formula I above, and preferably n is 0, 1, 2, 3, 4 or 5, and more preferably n is 0, 1, 2 or 3; and p is greater than zero and is the mole fraction of the fused sulfur ring units based on total units in the polymer.

Polymers of the invention also may contain oxygen or sulfur ring groups that are spaced from the polymer backbone. The spaced oxygen or sulfur ring group suitably will contain a single ring, although polycyclic rings that contain one or more oxygen or sulfur ring members also will be suitable. Less preferred are groups where sulfur or oxygen is a bridgehead atom of a polycyclic group, particularly a bridgehead of a bicyclic group such as a oxonorbornyl or thionorbornyl group, especially if such oxonorbornyl or thionorbornyl group is present as part of an ester moiety.

For example, suitable spaced oxygen and/or sulfur ring groups of polymer of the invention include those of the following Formula III:

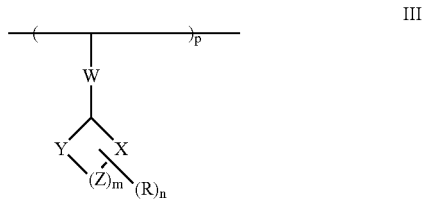

III wherein W is a linker; X, Y, and each Z are each independently carbon, oxygen, or sulfur, with at least one of X, Y or Z being oxygen or sulfur;

each R is the same or different non-hydrogen substituent such as those non-hydrogen substituents specified for R in Formula I above;

m is 1, 2, 3, 4 or 5; n is an integer of from 0 to the maximum value substitution permitted by the valences of the ring members; and p is the mole percent of the units in the polymer.

Typical W linker groups of Formula III include e.g. optionally substituted alkylene particularly optionally substituted $C_{1-8}$ alkylene; optionally substituted alkenylene particularly optionally substituted $C_{2-8}$ alkenylene; optionally substituted alkynylene particularly optionally substituted $C_{2-8}$ alkynylene; optionally substituted heteroalkylene particularly optionally substituted $C_{1-8}$ heteroalkylene; optionally substituted heteroalkenylene particularly optionally substituted $C_{2-8}$ heteroalkenylene; optionally substituted heteroalkynylene particularly optionally substituted $C_{2-8}$ heteroalkynylene; an ester linkage (i.e. —C(=O)O); and the like. In Formula III, the spaced oxygen or sulfur ring group may be a component of a photoacid-labile group, such as a photoacid-labile ester group. Such groups may be provided by polymerization of the corresponding acrylate or methacrylate groups.

Preferably, a sulfur heteroalicyclic group will be present in a polymer with polymerized carbon alicyclic olefin compounds. More specifically, preferred polymers of the invention include those that comprise a structure of the following Formula IV;

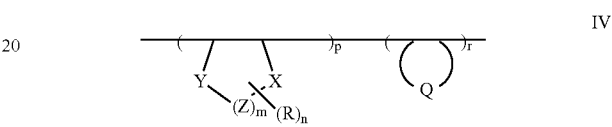

IV wherein X, Y, Z, R, m, n and p are each the same as defined in Formula II above;

Q and r are the same as defined for Formula I above.

Preferred carbon alicyclic ring units are polymerized optionally substituted norbornene groups. Thus, preferred polymers that contain sulfur heteroalicyclic units comprise a structure of the following Formula IVA;

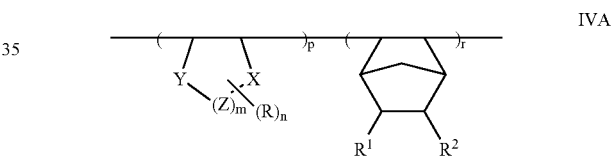

IVA wherein X, Y, Z, R, m and n are the same specified for Formula II above;

$R^1$ and $R^2$ are the same as defined in Formula IA above, p is the mole fraction of the fused sulfur ring units based on total units in the polymer; and r is the mole fraction of the fused optionally substituted norbornene ring units based on total units in the polymer, and p and r are each greater than zero.

Particularly preferred sulfur ring polymer units include those that have five, six, seven or eight ring members and a sulfur ring member adjacent to the polymer backbone.

Accordingly, preferred are polymers that comprise a structure of the following Formula IVB:

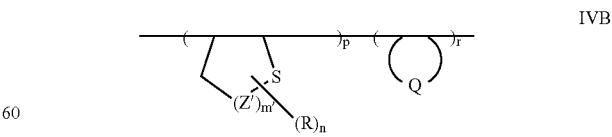

IVB wherein each Z' is independently oxygen, sulfur or carbon, and preferably is carbon; m' is 1, 2, 3 or 4; and R and n are each the same as defined in Formula I above, and preferably n is 0, 1, 2, 3, 4 or 5, and more preferably n is 1, 2 or 3;

Q is the same as defined in Formula I;

p is the mole fraction of the fused sulfur ring units based on total units in the polymer; and r is the mole fraction of the fused carbon alicyclic ring units based on total units in the polymer, and p and r are each greater than zero.

Preferred polymers of Formula IVB contain polymerized norbornene units, e.g. polymers that comprise a structure of the following Formula IVC:

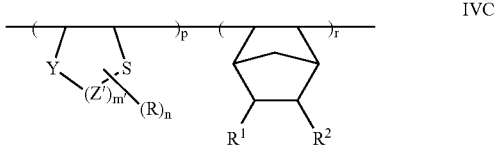

IVC wherein Z', m', R, n, and p are the same as defined in Formula IVB; and $R^1$, $R^2$ and r are the same as defined in Formula IA.

In the above Formulae I, IA, IB, IC, II, IIA, III, IV, IVA, IVB and IVC, and the below Formulae V, VI and VII (together sometimes referred to herein simply as "the formulae" or similar phrase), preferably R substituents of the depicted heteroalicyclic unit are electron-donating groups such as optionally substituted alkyl, optionally substituted alkoxy or optionally substituted alkylthio. Such electron-donating groups can facilitate polymerization of the corresponding vinyl heteroalicyclic monomer.

Preferred polymers of the invention will contain at least about 2 to 5 mole percent of fused heteroalicyclic units based on total units of the polymer; more preferably from about 5 to 50 mole percent of fused heteroalicyclic units based on total units of the polymer; still more preferably from about 5 or 10 to about 40 or 50 percent of fused heteroalicyclic units based on total units of the polymer.

Preferred polymers of the invention will contain at least about 2 to 5 mole percent of carbon alicyclic units based on total units of the polymer; more preferably from about 5 to 50 mole percent of fused carbon alicyclic units based on total units of the polymer; still more preferably from about 5 or 10 to about 25 or 30 percent of fused carbon alicyclic units based on total units of the polymer.

In polymers of the invention that contain only heteroalicyclic units and carbon alicyclic units, preferably the heterocyclic units will be present in an amount of from about 5 to about 90 or 95 mole percent based on total polymer units, and the carbon alicyclic units will be present in an amount of from about 5 to about 90 or 95 mole percent based on total polymer units.

In polymers of the invention that consist of heteroalicyclic units, carbon alicyclic units and maleic anhydride units (i.e. heteroalicyclic:carbon alicyclic:maleic anhydride terpolymers), preferably the heterocyclic units will be present in an amount of from about 5 to about 10, 20, 30, 40, 50, 60, 70 or 80 mole percent based on total polymer units, the carbon alicyclic units (such as optionally substituted norbornene) will be present in an amount of from about 5 to about 10, 20, 30, 40, 50, 60, 70 or 80 mole percent based on total polymer units, and the maleic anhydride units will be present from about 5 to about 20, 30, 40 or 50 mole percent based on total polymer units; and more preferably the heterocyclic units will be present in an amount of from about 5 to about 10, 20, 30, 40, 50 or 60 mole percent based on total polymer units, the carbon alicyclic units will be present in an amount of from about 5 to about 10, 20, 30, 40, 50 or 60 mole percent based on total polymer units, and the maleic anhydride units will be present from about 5 to about 10, 15, 20, 25, 30, 40, or 50 mole percent based on total polymer units. In such terpolymers, suitably either or both the heteroalicyclic or carbon alicyclic units will contain a photoacid labile substituents such as a photoacid-labile ester substituent.

In the above the above formulae, the R, $R^1$ and $R^2$ substituents each can be photoacid-labile groups. Photoacid-labile ester groups are generally preferred such as a tert-butyl ester, or an ester containing a tertiary alicyclic group. Such photoacid-labile esters may be directly pendant from a heteroalicyclic or carbon alicyclic polymer unit (i.e. —C(═O)OR, where R is tert-butyl or other non-cyclic alkyl group, or a tertiary alicyclic group), or the ester moieties may be spaced from the from a heteroalicyclic or carbon alicyclic polymer unit, e.g. by an optionally alkylene linkage (e.g. —$(CH_2)_{1-8}$C(═O)OR, where R is tert-butyl or other non-cyclic alkyl group, or a tertiary alicyclic group).

In any event, polymers of the invention preferably comprise contain one or more repeat units that comprise a photoacid-labile group. As discussed with respect to substituents R, $R^1$ and $R^2$ of the above formulae, the photoacid-labile may be a substituent of a heteroalicyclic or carbon alicyclic ring member. Alternatively, and generally preferred, the photoacid-labile moiety will be a polymer repeat unit distinct from repeat units containing a heteroalicyclic group.

Preferred photoacid-labile groups are ester groups, particularly esters that contain a tertiary alicyclic hydrocarbon ester moiety. Preferred tertiary alicyclic hydrocarbon ester moieties are polycyclic groups such adamantyl, ethylfencyl or a tricyclo decanyl moiety. References herein to a "tertiary alicyclic ester group" or other similar term indicate that a tertiary alicyclic ring carbon is covalently linked to the ester oxygen, i.e. —C(═O)O—TR' where T is a tertiary ring carbon of alicyclic group R'. In at least many cases, preferably a tertiary ring carbon of the alicyclic moiety will be covalently linked to the ester oxygen, such as exemplified by the below-depicted specifically preferred polymers. However, the tertiary carbon linked to the ester oxygen also can be exocyclic to the alicyclic ring, typically where the alicyclic ring is one of the substituents of the exocyclic tertiary carbon. Typically, the tertiary carbon linked to the ester oxygen will be substituted by the alicyclic ring itself, and/or one, two or three alkyl groups having 1 to about 12 carbons, more typically 1 to about 8 carbons, even more typically 1, 2, 3 or 4 carbons. The alicyclic group also preferably will not contain aromatic substitution. The alicyclic groups may be suitably monocyclic, or polycyclic, particularly bicyclic or tricyclic groups.

Preferred alicyclic moieties (e.g. group TR' of —C(═O)O—TR') of photoacid labile ester groups of polymers of the invention have rather large volume. It has been found that such bulky alicyclic groups can provide enhanced resolution when used in copolymers of the invention.

More particularly, preferred alicyclic groups of photoacid labile ester groups will have a molecular volume of at least about 125 or about 130 Å$^3$, more preferably a molecular volume of at least about 135, 140, 150, 155, 160, 165, 170, 175, 180, 185, 190, 195, or 200 Å$^3$. Alicyclic groups larger than about 220 or 250 Å$^3$ may be less preferred, in at least some applications. References herein to molecular volumes designate volumetric size as determined by standard computer modeling, which provides optimized chemical bond lengths and angles. A preferred computer program for determining molecular volume as referred to herein is Alchemy 2000, available from Tripos. For a further discussion of computer-based determination of molecular size, see T Omote et al, *Polymers for Advanced Technologies*, volume 4, pp. 277–287.

Particularly preferred tertiary alicyclic groups of photoacid-labile units include the following, where the wavy line depicts a bond to the carboxyl oxygen of the ester group, and R is suitably optionally substituted alkyl, particularly $C_{1-8}$ alkyl such as methyl, ethyl, etc.

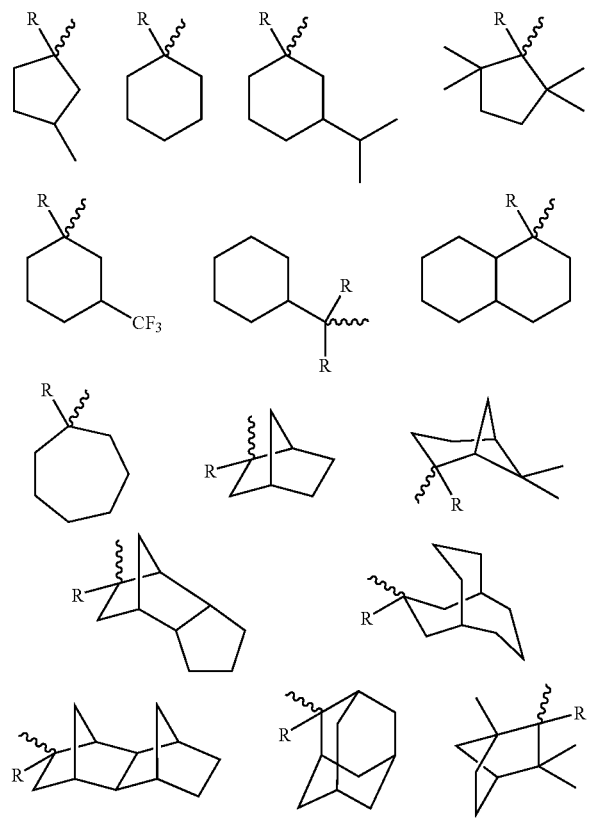

Polymers of the invention also may contain photoacid-labile groups that do not contain an alicyclic moiety. For example, polymers of the invention may contain photoacid-labile ester units, such as a photoacid-labile alkyl ester. Generally, the carboxyl oxygen (i.e. the carboxyl oxygen as underlined as follows: —C(=O)O) of the photoacid-labile ester will be covalently linked to the quaternary carbon. Branched photoacid-labile esters are generally preferred such as t-butyl and —$C(CH_3)_2CH(CH_3)_2$.

Polymers of the invention also may contain additional units such as cyano units, lactone units or anhydride units. For example, acrylonitrile or methacrylonitrile may be polymerized to provide pendant cyano groups, or maleic anhydride may be polymerized to provide a fused anhydride unit.

Particularly preferred polymers of the invention include those that comprise a structure of the following Formula V:

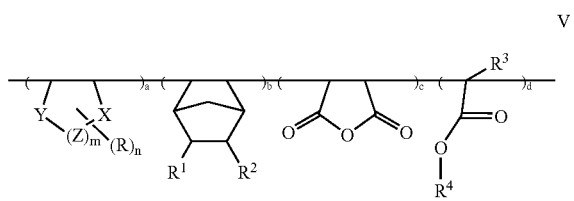

V wherein X, Y, Z, R, m and n are each the same as defined in Formula I above;

$R^1$ and $R^2$ are each independently hydrogen or a non-hydrogen substituent such as specified for $R^1$ and $R^2$ in Formula IA above;

$R^3$ is hydrogen or alkyl, particularly $C_{1-6}$ alkyl such as methyl;

$R^4$ is a group that renders the depicted ester photoacid-labile, such as a tertiary alicyclic group as discussed above, or a branched non-cyclic optionally substituted alkyl group, with the ester carboxyl group being directly bonded to a quaternary (i.e. no hydrogen substituents) carbon atom; and a, b, c, and d are each greater than zero and are mole fractions of the respective polymer units.

Preferred polymers of the invention also include those of the following Formula VI:

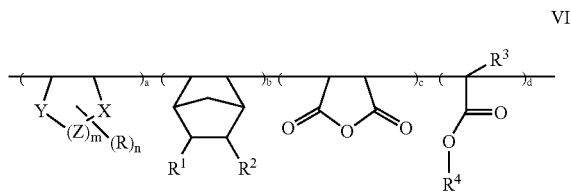

VI wherein X, Y, Z, R, m and n are each the same as defined in Formula II above;

$R^1$ and $R^2$ are each independently hydrogen or a non-hydrogen substituent such as such as specified for $R^1$ and $R^2$ in Formula IA above;

$R^3$ is hydrogen or alkyl, particularly hydrogen or $C_{1-6}$ alkyl such as methyl;

$R^4$ is a group that renders the depicted ester photoacid-labile, such as a tertiary alicyclic group as discussed above, or a branched non-cyclic optionally substituted alkyl group, with the ester carboxyl group being directly bonded to a quaternary (i.e. no hydrogen substituents) carbon atom; and a, b, c, and d are each greater than zero and are mole fractions of the respective polymer units.

In each of above Formulae V and VI, preferably "a" (mole fraction of heterocyclic units) is from about 2 to 50 mole percent based on total polymer units; more preferably "a" is from about 2 to about 40 mole percent based on total polymer units; and still more preferably "a" is from about 2 to about 30 mole percent based on total polymer units.

In each of above Formulae V and VI, preferably "b" (mole fraction of norbornene units) is from about 2 to 25 mole percent based on total polymer units; more preferably "b" is from about 2 to about 20 mole percent based on total polymer units; and still more preferably "b" is from about 2 to about 15 or 20 mole percent based on total polymer units.

In each of above Formulae V and VI, preferably "c" (mole fraction of anhydride units) is from about 0 (i.e. no anhydride units) to 50 mole percent based on total polymer units; more preferably "c" is from about 2 to about 40 mole percent based on total polymer units.

In each of above Formulae V and VI, preferably "d" (mole fraction of photoacid-labile ester unit) is from about 2 to 70 mole percent based on total polymer units; more preferably "d" is from about 5 or 10 to about 70 mole percent based on total polymer units; still more preferably "d" is from about 5 or 10 to about 50 mole percent based on 10 total polymer units.

Preferred heteroalicyclic units of Formulae V and VI are the same as described above regarding Formulae IA and IIA respectively.

As discussed above, polymers of the invention are preferably employed in photoresists imaged at short wavelengths, particularly sub-200 nm such as 193 nm and 157 nm. Polymers also can be employed in photoresists imaged at higher wavelengths such as 248 nm. For such higher wavelength applications, the polymer may suitably contain aromatic units, e.g. polymerized styrene or hydrostyrene units.

Specifically preferred polymers of the invention include those of the following Formula VII:

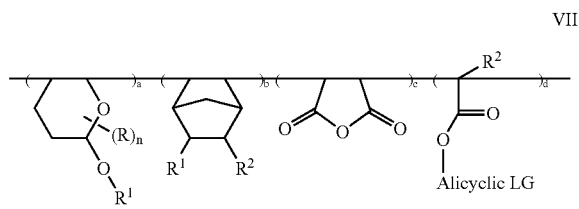

In Formula VII above, "Alicyclic LG" is the same as defined for alicyclic substituent $R^4$ in Formulae V and VI above and is preferably methyladamantyl, 8-ethyl-8-tricyclodecanyl, ethylfencyl and the like; $R^1$ is $C_{1-8}$ alkyl, preferably $C_{1-4}$ alkyl, o9r a moiety that forms a photoacid-labile group; $R^2$ is suitably hydrogen or $C_{1-8}$ alkyl, such as methyl, ethyl, propyl and the like; $R^{1'}$ and $R^{2'}$ are the same as defined for $R^1$ and $R^2$ respectively in Formula IA above; and a, b, c and d are mole percents of the specified units in the polymer based on total polymer units. Preferably a (mole percent of oxygen alicyclic units) is from 1 to about 5, 10, 20, 30, 40, 50 or 60 mole percent; b (mole percent of optionally substituted norbornene units) is from 1 to about 5, 10, 20, 30, 40, 50 or 60 mole percent; c (mole percent of maleic anhydride units) is from 1 to about 5, 10, 20, 30, 40, or 50 mole percent. Units d (acrylate photoacid-labile units) may be not be present (i.e. d is zero) where the heterocyclic or norbornene units contain a photoacid-labile units, or d may be suitably present at from about 2 to 10, 20, 30, 40 or 50 mole percent based on total polymer units.

As discussed, various moieties may be optionally substituted, including groups of Formulae I, IA, II, IIA, III, IV, IVA, IVB, IVC, V, VI, and VII. A "substituted" substituent may be substituted at one or more available positions, typically 1, 2, or 3 positions by one or more suitable groups such as e.g. halogen (particularly F, Cl or Br); cyano; $C_{1-8}$ alkyl; $C_{1-8}$ alkoxy; $C_{1-8}$ alkylthio; $C_{1-8}$ alkylsulfonyl; $C_{2-8}$ alkenyl; $C_{2-8}$ alkynyl; hydroxyl; nitro; alkanoyl such as a $C_{1-6}$ alkanoyl e.g. acyl and the like; etc.

Preferred alkanoyl groups, including as specified in the above formulae, will have one or more keto groups, such as groups of the formula —C(=O)R" where R" is hydrogen or $C_{1-8}$ alkyl. Suitable lactone groups, including as specified in the above formulae, include alpha-butyrolactone groups and the like.

Polymers of the invention can be prepared by a variety of methods. One suitable method is an addition reaction which may include free radical polymerization, e.g., by reaction of selected monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran, ethyl lactate and the like. Suitable reaction temperatures for any particular system can be readily determined empirically by those skilled in the art based on the present disclosure. A variety of free radical initiators may be employed. For example, azo compounds may be employed such as azo-bis-2,4-dimethylpentanenitrile. Peroxides, peresters, peracids and persulfates also could be employed.

Other monomers that can be reacted to provide a polymer of the invention can be identified by those skilled in the art. For example, to provide photoacid-labile units, suitable monomers include e.g. methacrylate or acrylate that contains the appropriate group substitution (e.g. tertiary alicyclic, t-butyl, etc.) on the carboxy oxygen of the ester group. Maleic anhydride is a preferred reagent to provide fused anhydride polymer units. Itaconic anhydride also is a preferred reagent to provide anhydride polymer units, preferably where the itaconic anhydride has purified such as by extraction with chloroform prior to polymerization. Vinyl lactones are also preferred reagents, such as alpha-butyrolactone.

Some suitable vinyl (endocyclic double bond) heterocyclic monomers that can be polymerized to provide polymers of the invention include the following:

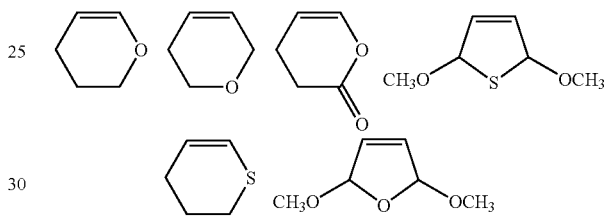

Preferably a polymer of the invention will have a weight average molecular weight (Mw) of about 800 or 1,000 to about 100,000, more preferably about 2,000 to about 30,000, still more preferably from about 2,000 to 15,000 or 20,000, with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

Polymers of the invention used in photoresist formulations should contain a sufficient amount of photogenerated acid labile ester groups to enable formation of resist relief images as desired. For instance, suitable amount of such acid labile ester groups will be at least 1 mole percent of total units of the polymer, more preferably about 2 to 50 mole percent, still more typically about 3 to 30 or 40 mole percent of total polymer units. See the examples which follow for exemplary preferred polymers.

As discussed above, the polymers of the invention are highly useful as a resin binder component in photoresist compositions, particularly chemically-amplified positive resists. Photoresists of the invention in general comprise a photoactive component and a resin binder component that comprises a polymer as described above.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

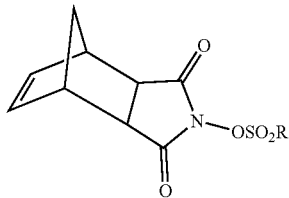

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

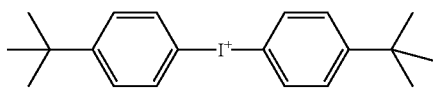

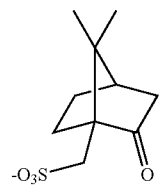

1

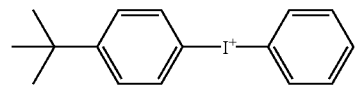

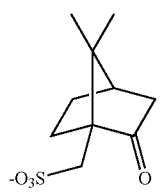

2

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$ alkyl), particularly perfluorooctanesulfonate, perfluorobutanesulfonate and the like.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly a sub-300 and sub-200 nm exposure wavelength. As discussed above, 193 nm is a particularly preferred exposure wavelength. 157 nm also is a preferred exposure wavelength. However, the resist compositions of the invention also may be suitably imaged at higher wavelengths. For example, a resin of the invention can be formulated with an appropriate PAG and sensitizer if needed and imaged at higher wavelengths e.g. 248 nm or 365 nm.

Following exposure, the film layer of the composition is preferably baked at temperatures ranging from about 70° C.

to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream After such processing, resist may be removed from the processed substrate using known stripping procedures.

All documents mentioned herein are incorporated herein by reference. The following non-limiting examples are illustrative of the invention.

EXAMPLES 1–2

Polymer Syntheses

Example 1

Synthesis of Tetrapolymer of:
2-(6-ethoxy)tetrahydropyran:norbornene:maleic anhydride:2-methyladmantyl (Respective Molar Ratio of Units of 10:20:30:40)

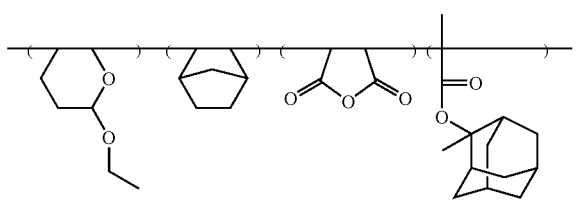

Composition 10/20/30/40

A mixture of 2-methyladamantyl methacrylate (60.0 g), maleic anhydride (18.84 g), norbornene (12.03 g), 3,4-dihydro-2-ethoxy-2-H-pyran (8.20 g) and V601 (photoinitiator; 3.73 g; 5 mole % of total monomers) in 99.07 g (1/1=monomer/solvent) of anhydride inhibitor free tetrahydrofuran was placed in a round-bottomed flask. After stirring for 5 minutes (until all solids were dissolved in the solvent), the flask was put into a pre-heated 70° C. oil bath. The reaction mixture was stirred at that temperature for 24 hours. After cooling, 99.07 g of THF was added to the reaction mixture. The polymer was isolated by precipitation into 2.0 L of hexane/isopropyl alcohol (1:1 wt. %). The suspension was stirred for 120 minutes. Then, the polymer was filtered off, and the filtered polymer was washed with an additional 200 mL of hexane. The polymer was dried in a vacuum oven at 40° C. for overnight (about 16 hours). Yield=76.3%.

Example 2

Synthesis of Tetrapolymer of:
2-(6-methoxy)tetrahydropyran:norbornene:maleic anhydride:2-methyladmantyl (Respective Molar Ratio of Units of 10:20:30:40)

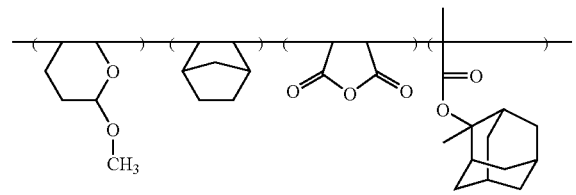

Composition 10/20/30/40

The title polymer was prepared by the same general procedures as disclosed above in Example 1, except 7.31 g of 3,4-dihydro-2-methoxy-2-H-pyran was used in place of 3,4-dihydro-2-ethoxy-2-H-pyran. Yield of polymer was 78.4%.

EXAMPLES 3–6

Syntheses of Monomers Useful in Preparation of Polymers of the Invention

Example 3

EtTCD Methacrylate Monomer Synthesis 8-ethyl-8-tricyclodecanylmethacrylate (EtTCD methacrylate) was prepared as following using the reagents and amounts thereof as specified in the following table.

| Material | Amt (g) | Amt (ml) | Moles | Source |
|---|---|---|---|---|
| TCD | 150.22 | | '1.00 | TCI |
| Ethylmagnesiumchloride (25%) | 390.85 | ~379.5 | ~1.10 | ACROS |
| Methacryloyl chloride | 120.22 | ~112.4 | ~1.15 | Aldrich |
| Tetrahydrofuran | 480 | 540 | | Aldrich |

All reaction glassware was dried in the oven overnight at 100° C. The glassware was set up and cooled under a stream of nitrogen. The reaction was carried out under a blanket of nitrogen.

To a 2L 3N-RB flask fitted with a gas inlet, thermometer, overhead stirrer and a rubber septum was added 400 g of ethylmagnesium chloride, 25 wt % solution in tetrahydrofuran (clear, amber solution) via a double tipped needle using nitrogen pressure. The mixture was cooled to –25 to –30° C. using a dry ice/isopropanol bath. While the ethylmagnesium chloride solution was cooling the 153.6 g of tricyclodecane (TCD) was dissolved in 480 g of tetrahydrofuran. To a 1 L 3N-RB flask equipped with a gas inlet, glass stopper and a rubber septum was added the 153.6 g of TCD, The anhydrous, inhibitor free tetrahydrofuran was transferred to the IL flask via a double tipped needle using nitrogen pressure. When the ethylmagnesium chloride was at –25 to –30° C., the TCD/THF solution was transferred over a 2 hr period to the 2L 3N-RB flask containing the ethylmagnesium chloride via a double tipped needle using nitrogen pressure. The cooling bath was removed and the reaction mixture was stirred for 2 hr. After stirring for 2 hr the mixture was again cooled to –25 to –30° C. using a dry ice/isopropanol bath. The methacryloyl chloride (120.22 g) was then added dropwise over a 1 hour period using a 125 ml pressure equalizing dropping funnel. The reaction was allowed to come to room temperature with overnight stirring. A white precipitate developed from the clear amber colored reaction solution. Water (DI) was added until all of the salts had dissolved (~500 ml) and two distinct layer were seen. The layers were separated and the organic (upper) layer was washed with 2×400 ml DI water then dried over magnesium sulfate. The THF was removed leaving 258 g of an orange oil. The orange oil was dissolved in 400 g of hexane then passed through a 400 g silica gel plug which had been pre-conditioned with hexane. The silica was washed with hexane until all of the product was removed (spot filtrate on a TLC plate and illuminate under short UV). The hexane was removed leaving 202.8 g of an clear, colorless oil. Theoretical yield: 248.4 g; yield: 81.6%

Example 4

Synthesis of Norbornene Valerolactone

A solution of valerolactone (50.1 g) in 150 mL of anhydrous THF was placed in a three-neck-bottomed flask at −78° C. (Dry Ice/acetone). To it, solution of LDA (250 mL, 2M) in 250 mL anhydrous THF was added dropwise. The reaction mixture was stirred at this temperature for 4 hours. Then, the thermal cracking of paraformaldehyde (36.94 g, excess) was bubbled into the reaction mixture. After the paraformaldehyde was all cracked, the reaction mixture was stirred at the same bath and stirred for overnight. Then, the solvent was removed by rotary pump and the residue was added 500 mL $CH_2Cl_2$ and washed with $NaHCO_3$ (aq, sat.) and water several times (3×500 mL). The combination organic solvent was dried over $MgSO_4$ and the solvent was removed by rotary pump. The desired product was distilled under vacuum (135–140° C./8 mmHg).

The methylene-valerolactone was dissolved in dichloromethane and freshly cracked cyclopentadiene was added. The reaction mixture was stirred at room temperature for 3 hours, then heated to 40° C., and held at 40° C. overnight. The reaction mixture was then slowly cooled to room temperature. The methylene chloride was removed under reduced pressure, leaving an oil. The crude oil was then distilled under reduced pressure to afford pure product.

Example 5

Synthesis of 8-methyltricyclodecanyl Methacrylate

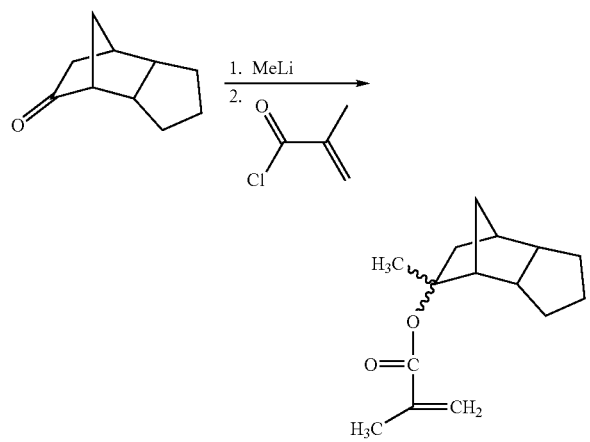

A solution of 125 ml of 1.4 M methyl lithium (in ethyl ether) in 100 ml of hexane was decanted into a three neck round-bottom flask at an ice-water bath. To it, a solution of 24.00 g of tricyclo[5.2.1.0]decan-8-one in hexane was added dropwise. After addition, the reaction mixture was stirred for 4 hours at 0° C. Then, a solution of 16 ml of methacroyl chloride in 100 ml of hexane was added dropwise at 0° C. After addition, the reaction mixture was stirred at the same bath for overnight (16 hours). After filtering the white salts, the organic layer was washed with water three times (3×300 ml). Then, the washed organic layer was dried over anhydrous $MgSO_4$. The organic solvent was removed by a rotary pump to give the crude title monomer (23.5 g). The monomer was purified by a flash column chromatography (purity >98%, silica gel with hexane). $^1$H NMR: 6.05 (1H), 5.50 (1H), 1.95 (3H), 1.65 (3H), 2.25-0.85 (14H).

Example 6

Synthesis of Pinanyl Methacrylate

Materials Used:

|  | Amount Charged | Moles | Source |
| --- | --- | --- | --- |
| cis-Pinan-2-ol | 15.43 g | 0.10 | Fluka |
| $Et_3N$ | 12.14 g | 0.12 | Aldrich, distilled before use |
| Methacryloyl chloride | 13.07 g | 0.125 | Aldrich, distilled before use |
| $CH_2Cl_2$ | 230 mL |  | Aldrich, dried and distilled |

Procedure:

All reaction glassware and needles were dried and flushed with dry $N_2$ before use and the reaction was carried out under nitrogen atmosphere.

1) Into a 500 mL 3-neck round-bottom-flask equipped with an addition funnel and a magnetic stirrer were added 15.43 g of cis-pinan-2-ol and 200 mL of dry $CH_2Cl_2$ (Stirred over $CaH_2$ overnight, then distilled and stored over activated molecular sieves). The resulting colorless solution was cooled with an ice-water bath.

2) Triethylamine (12.14 g) was added through the addition funnel to the cooled $CH_2Cl_2$ solution over 10 min. After added, the resulting solution was kept in a dry-ice/acetone bath (−67° C.).

3) A $CH_2Cl_2$ (30 mL) solution of methacryloyl chloride (13.07 g) was added dropwisely over 20 min. The resulting orangish suspension was allowed to warm to room temperature and stirred for 2 h.

4) The chloride salts were filtered off. The filtrate was washed with saturated $Na_2CO_3$ solution (2×200 mL), then DI water (3×200 mL),-and dried over anhydrous $MgSO_4$.

5) The slightly yellow CH$_2$Cl$_2$ solution was concentrated on a rotary evaporator (bath temperature kept below 35°) to yield a clear slightly yellow liquid product. Yield=79%. The product was judged pure by NMR.

Example 7

Photoresist Preparation and Lithographic Processing

A photoresist of the invention is prepared by mixing the following components with amount expressed as weight percents based on total weight of the resist composition:

| Resist components | Amount (wt. % based on total solids) |
|---|---|
| Resin binder | 28.2 |
| Photoacid generator | 0.52 |
| Basic additive | 0.03 |
| Surfactant | 0.03 |

The resin binder is the polymer of Example 2 above. The photoacid generator is triphenylsulfonium triflate. The basic additive is triisopropnaol amine. The surfactant is Silwet (Dow Chemical). Those resist components were formulated at 16 wt. % solids in a solvent of 2-heptatone.

The formulated resist composition is spin coated onto HMDS vapor primed 4 inch silicon wafers and softbaked via a vacuum hotplate at 130° C. for 60 seconds. The resist coating layer is exposed through a photomask at 193 nm using an ISI microstepper, and then the exposed coating layers are post-exposure baked (PEB) at about 130° C. The coated wafers are then treated with 0.26N aqueous tetramethylammonium hydroxide solution to develop the imaged resist layer and provide a relief image.

Highly resolved 0.13 μm equal lines and spaces (1:1) were obtained.

Example 8

Comparative Example

A resist formulation was prepared of essentially the same components and amounts thereof as in Example 7 above, but where the polymer (resin binder) did not contain a polymerized ether, or other heteroalicyclic unit. The resist was processed as described in Example 7. The smallest resolved equal lines and spaces (1:1) that could be obtained were 0.14 μm.

Example 9

Plasma Etch Tests

Oxide plasma etch rates of polymers of the invention were examined.

A first (comparative) terpolymer was tested for etch rates. That terpolymer contained polymerized units of p-hydroxystyrene, styrene and t-butylacrylate in respective molar ratios of 65:20:15.

Three tetrapolymers of the invention (referred to below as Polymers 1, 2 and 3 respectively) having the following structure were then tested for etch rates.

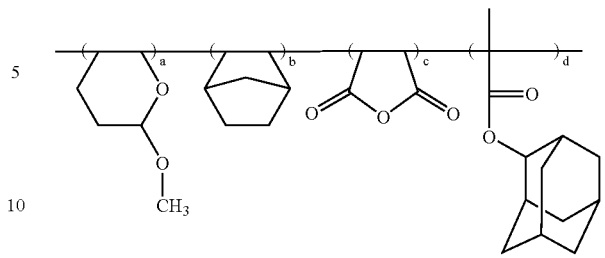

In Polymer 1, the molar ratio of polymer units a:b:c:d was 10:20:30:40.

In Polymer 2, the molar ratio of polymer units a:b:c:d was 10:15:25:50.

In Polymer 3, the molar ratio of polymer units a:b:c:d was 10:10:20:60.

Polymer 1 exhibited three percent greater oxide etch rate resistance than the comparative hydroxystyrene/styrene/t-butylacrylate terpolymer. Polymer 2 exhibited five percent greater oxide etch rate resistance than the comparative hydroxystyrene/styrene/t-butylacrylate terpolymer. Polymer 3 exhibited eight percent greater etch rate resistance than the comparative hydroxystyrene/styrene/t-butylacrylate terpolymer.

The foregoing description of the invention is merely illustrative thereof, and it is understood that variations and modification can be made without departing from the spirit or scope of the invention as set forth in the following claims.

What is claimed is:

1. A photoresist comprising a photoactive component and a polymer that comprises: i) a heteroalicyclic group that does not contain a carbonyl ring member and is fused to the polymer backbone and that contains one or more oxygen or sulfur ring atoms; ii) a carbon alicyclic group fused to the polymer backbone; and iii) polymerized acrylate that comprises a photoacid-labile moiety.

2. The photoresist of claim 1 wherein the heteroalicyclic group has an oxygen ring member.

3. The photoresist of claim 1 wherein the heteroalicyclic group has a sulfur ring member.

4. The photoresist of claim 1 wherein the carbon alicyclic group is a polymerized norbornene group.

5. The photoresist of claim 1 wherein the heteroalicyclic group has a non-hydrogen ring substituent.

6. The photoresist of claim 1 wherein the polymer is a tetrapolymer or pentapolymer.

7. The photoresist of claim 1 wherein the polymer is completely free of aromatic groups.

8. The photoresist of claim 1 wherein the photoacid-labile moiety is a substituent of the heteroalicyclic group or carbon alicyclic group.

9. The photoresist of claim 1 wherein the photoacid-labile moiety is a polymer unit distinct from the heteroalicyclic group and carbon alicyclic group.

10. The photoresist of claim 1 wherein the polymer further comprises lactone or anhydride units.

11. The photoresist of claim 1 wherein the polymer further comprises polymerized maleic anhydride groups.

12. The photoresist of claim 1 wherein the heteroalicyclic group fused to the polymer backbone does not contain an unsaturated oxygen.

13. The photoresist of claim 1 wherein the heteroalicyclic group fused to the polymer backbone does not contain an unsaturated sulfur.

14. The photoresist composition of claim 1 wherein the polymer is at least substantially free of aromatic groups.

15. The photoresist composition of claim 1 wherein the heteroalicyclic group is not an anhydride or lactone.

16. The photoresist composition of claim 1 wherein the heteroalicyclic group contains a single ring oxygen atom.

17. An article of manufacture comprising a microelectronic wafer substrate or a flat panel display substrate having coated thereon a layer of a photoresist composition of claim 1.

18. A method of forming a positive photoresist relief image, comprising:

(a) applying a coating layer of a photoresist of claim 1 on a substrate; and (b) exposing and developing the photoresist image to yield a relief image.

19. The method of claim 18 wherein the photoresist layer is exposed with radiation having a wavelength of less than about 200 nm.

20. The method of claim 18 wherein the photoresist layer is exposed with radiation having a wavelength of about 193 nm.

* * * * *